United States Patent [19]

Hancock

[11] Patent Number: 5,453,712
[45] Date of Patent: Sep. 26, 1995

[54] CIRCUIT FOR ACCURATELY DISCHARGING A CAPACITOR

[75] Inventor: Peter G. Hancock, Plano, Tex.

[73] Assignee: Honeywell Inc., Minneapolis, Minn.

[21] Appl. No.: 378,212

[22] Filed: Jan. 25, 1995

[51] Int. Cl.⁶ .............................. H03K 17/60; G05F 1/10; G05F 3/04
[52] U.S. Cl. ........................ 327/478; 327/481; 327/482; 327/530; 327/535; 327/538; 327/578; 323/312
[58] Field of Search ..................................... 327/478, 481, 327/482, 490, 511, 578, 530, 535, 538, 425, 426, 432, 436; 257/560, 564, 574, 575; 323/312, 317

[56] References Cited

U.S. PATENT DOCUMENTS

| | | | |
|---|---|---|---|
| 4,339,765 | 7/1982 | Nakamura et al. | 257/560 |
| 4,797,577 | 1/1989 | Hing | 327/578 |
| 4,992,731 | 2/1991 | Lorenzen | 327/510 |
| 5,017,816 | 5/1991 | Wilcox | 327/481 |

Primary Examiner—Timothy P. Callahan
Assistant Examiner—Trong Phan
Attorney, Agent, or Firm—William D. Lanyi

[57] ABSTRACT

A subcircuit for discharging a capacitor at a preselected rate incorporates a first transistor and a second transistor connected with the emitter of the first transistor providing current to the collector of the second transistor. The base of the first transistor is connected to a capacitor to be discharged at a preselected rate. The base current of the first transistor discharges the capacitor as a function of the base current provided to the second transistor. In order to provide a current of very small magnitude to the base of the second transistor, a plurality of lateral PNP transistors are connected in a plural stage arrangement in order to take advantage of the current dividing characteristic of lateral PNP transistors. A collector of one lateral PNP transistor is connected to the emitter of another so that each stage of the subcircuit reduces the output current by a very precise ratio.

13 Claims, 7 Drawing Sheets

CIRCUIT FOR ACCURATELY DISCHARGING A CAPACITOR

BACKGROUND OF THE INVENTION

1. Field of the Invention

The present invention is generally related to circuits that require a capacitor to be discharged over a precisely determined period of time and, more particularly, to a circuit in which a very small, but accurately determined electrical current is provided to discharge a capacitor in a peak detecting circuit.

2. Description of the Prior Art

Many different types of peak detecting circuits are known to those skilled in the art. Some circuits of this type are used in association with gear tooth sensors that measure relative change in magnetic field strength as a result of the passage of ferromagnetic discontinuities through a detection zone proximate a magnetically sensitive device, such as a Hall effect element. The basic theory of operation of a device of this type is to provide a magnetically sensitive component with a bias magnet which causes the magnetically sensitive component to provide an output signal that is responsive to the strength of a magnetic field perpendicular to its plane. Although the magnetically sensitive device can be a magnetoresistive circuit, it is common to use Hall effect elements for these purposes. A rotating device, such as a gear, has a plurality of ferromagnetic discontinuities, or teeth. As the teeth move through the detection zone, the magnetic field is disturbed and caused to change from one state to another as the teeth and interstitial slots move through the detection zone. Often, devices of this type operate under the principle that a tooth will cause the output signal from the Hall device to change in one direction relative to an average signal from both a tooth and a slot while the interstitial slot will cause the output signal from the Hall device to move in the opposite direction. In this way, a circuit associated with the gear tooth sensor determines an average signal level for the teeth and the slots and then compares the instantaneous signal to the average in order to determine whether a tooth or a slot is moving through the detection zone. Alternative circuit configurations store minimum values and create reference thresholds based on the minimum values. In other words, if the minimum value of 1500 gauss is stored by a monitoring circuit, it would be possible to use a value of 1560 gauss as a threshold to trigger a digital output signal. This threshold would be selected by adding 60 gauss to the minimum stored value. Circuits of these types can use either average values, minimum values or maximum values as the stored signal level that is used to provide a reference signal or threshold magnitude. These circuits are well known to those skilled in the art.

U.S. Pat. No. 4,992,731, which issued to Lorenzen on Feb. 12, 1991, describes a rotary speed sensor with base line compensation of a Hall cell output signal. The rotary speed sensor described in the Lorenzen patent uses a permanent magnet and a Hall cell which is sensitive to the changing tangential component of magnetic field caused by the interrupted surface profile of a rotary element. In order to avoid anomalies caused by the variation of the base value of the tangential component of magnetic field, the output of the differential amplifier is feed by the Hall cell and is connected to a voltage averaging circuit which stores the average voltage of the output on a single capacitor. The output of the differential amplifier and the voltage across the capacitor are respectively coupled to the differential inputs of a Schmitt trigger exhibiting hysteresis. The Schmitt trigger thereby establishes operate and release points relative to the average voltage signal. The voltage averaging circuit is a nonlinear circuit in which the voltage across the capacitor is feed back to the negative input of an operational amplifier. A power-up circuit is also provided for rapidly charging the capacitor initially to approximately the average voltage.

In circuits of the type described immediately above, it is necessary for the average signal to be available as a reference when the next tooth passes through the detection zone. Otherwise, the comparison between the instantaneous signal and the average signal can not appropriately be made. U.S. Pat. No. 4,992,731, which is described above, takes steps to rapidly charge the capacitor initially, during startup, to a magnitude which is approximately equivalent to the average voltage that will be stored by the capacitor during normal operation. However, several other problems can occur in the operation of a circuit of this type or the type that stores a maximum or minimum value that is used as a bases for determining a threshold magnitude. For example, electrical noise can cause the voltage signal stored by the capacitor to be excessively small or excessively large during either start-up or during later operation.

In order to assure that a proper value is available for use as a reference as each subsequent ferromagnetic discontinuity, or tooth, moves toward the detection zone, it would be advantageous if a means was provided to discharge the capacitor over a preselected and precise period of time and at the same time provide a buffer or detector for the capacitor voltage.

SUMMARY OF THE INVENTION

A subcircuit made in accordance with the present invention, for discharging a capacitor, comprises a capacitor that is connected between a first circuit point and a second circuit point. It also comprises a first transistor whose base is connected to the first circuit point. The present invention further comprises a second transistor. The collector of the second transistor is connected to the emitter of the first transistor and the emitter of the second transistor is connected to a point of ground potential. In addition, the subcircuit of the present invention comprises a means for providing a predetermined current. The current providing means is connected to the base of the second transistor.

In a particularly preferred embodiment of the present invention, both the first and second transistors are NPN transistors. In addition, the second circuit point is a point of ground potential.

By providing a precise base current to the second transistor, a precise current can be drawn through the base of the first transistor. This drains the charge from the capacitor through the base of the first transistor at a preselected and precise rate. Therefore, the voltage potential across the capacitor is discharged at a precise rate and can be used as an appropriate reference value for subsequent comparisons between an instantaneous signal and an average signal.

To provide a small current, the present invention comprises a first lateral PNP transistor having a first collector and a second collector. The first collector is configured to conduct a current N times the current conducted by the second collector and the first collector is connected to the base of the first lateral PNP transistor. In addition, the present invention further comprises a means for providing a first current as an input to the emitter of the first lateral PNP transistor. The present invention comprises a second lateral PNP transistor having a third collector and a fourth collector. The third collector is configured to conduct a current that is N times the current conducted by the fourth collector. The third collector is connected to the base of the second lateral PNP transistor and the second collector is connected to the emitter of the second lateral PNP transistor. The base of the first lateral PNP transistor is connected to the base of the second lateral PNP transistor via a diode and the fourth collector conducts a current which is a first predetermined fraction of the first current provided to the emitter of the first lateral PNP transistor. The magnitudes of the N's for the various components need not be equal.

In one embodiment of the present invention, the subcircuit further comprises a third lateral PNP transistor which has a fifth collector and a sixth collector. The fifth collector is configured to conduct a current that is N times the current conducted by the sixth collector. The fifth collector is connected to the base of the third lateral PNP transistor and the fourth collector is connected to the emitter of the third lateral PNP transistor. The base of the second lateral PNP transistor is connected to the base of the third lateral PNP transistor via a diode and the sixth collector conducts a current which is a second predetermined fraction of the first current. A first diode is connected between the base of the first lateral PNP transistor and the base of the second lateral PNP transistor and a second diode is connected between the base of the third lateral PNP transistor and the base of the second lateral PNP transistor.

BRIEF DESCRIPTION OF THE DRAWINGS

The present invention will be more fully and completely understood from a reading of the Description of the Preferred Embodiment in conjunction with the drawings, in which.

DESCRIPTION OF THE PREFERRED EMBODIMENT

Figure 1:
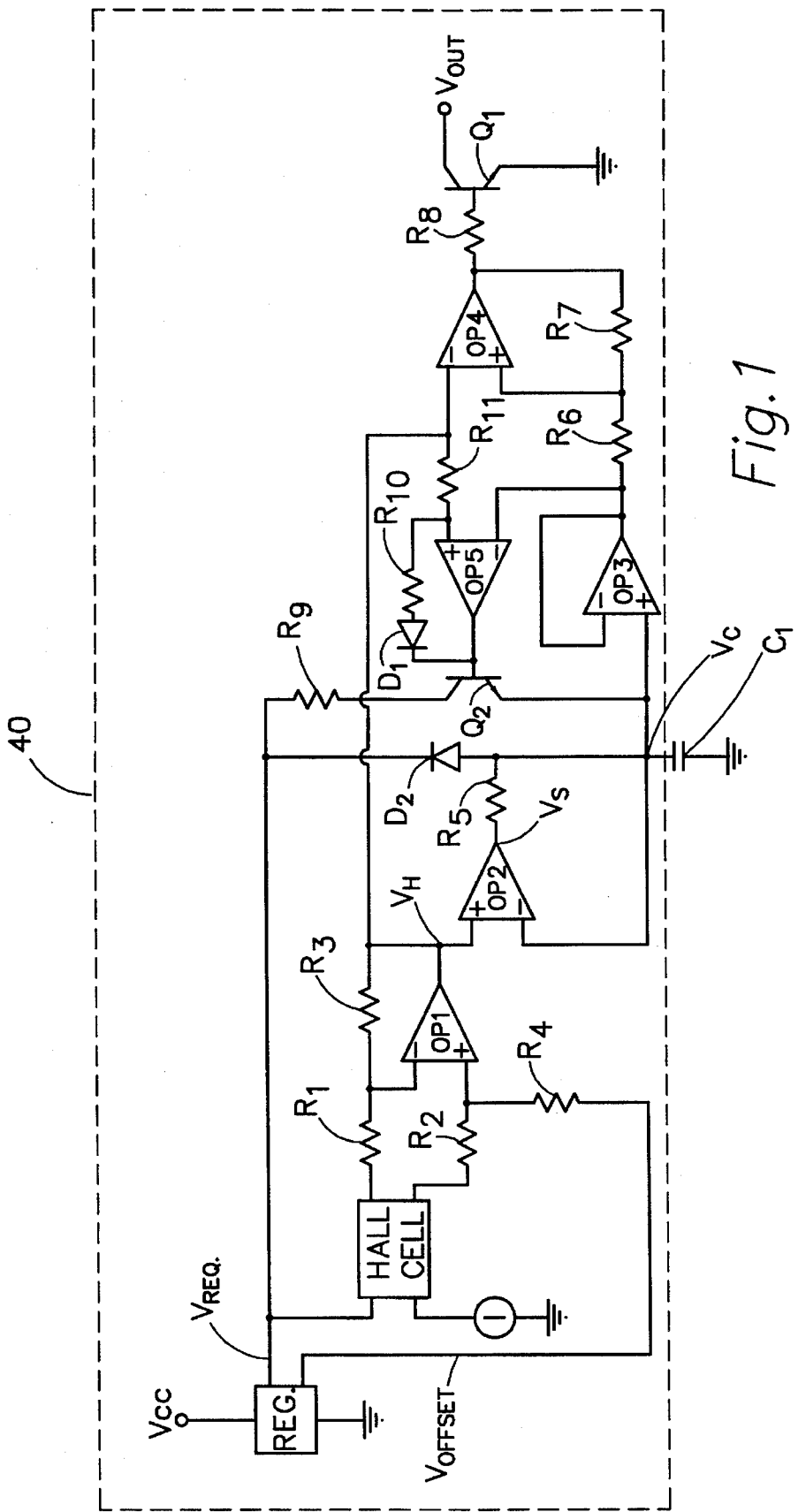
FIG. 1 illustrates a known circuit that utilizes a capacitor to store a reference magnitude.

Throughout the Description of the Preferred Embodiment, like components will be identified by like reference numerals. As discussed above, U.S. Pat. No. 4,992,731 describes a peak detecting circuit which utilizes a capacitor to store an average value. Instantaneous values are then compared to the average value. As such, U.S. Pat. No. 4,992,731 describes the way in which the capacitor is used for these purposes and describes the appropriate selection of components and arrangement of components in the circuit to achieve these purposes. For these reasons, U.S. Pat. No. 4,992,731 is explicitly incorporated by reference herein. FIG. 1 is a reproduction of FIG. 6 from U.S. Pat. No. 4,992,731. The inter-relationship between the components identified in FIG. 1 are described in detail in U.S. Pat. No. 4,992,731 with respect to FIG. 6 contained therein.

With respect to FIG. 1, operational amplifier OP2, resistor $R_5$ and capacitor C1 form a voltage averaging circuit which closely maintains the base value of $V_H$, which is described in U.S. Pat. No. 4,992,731 as $V_{avg}$, as the voltage $V_c$ across the capacitor C1. It should be appreciated that a linear RC circuit is not suitable for averaging $V_H$ because of the large time constant, in the range of 0.1 to 50 seconds necessary to average over several slow rotations of a wheel. In addition, the typical high temperature environment of the speed sensor (e.g. 150 degrees centigrade) when in association with an internal combustion engine because the large capacitor can exhibit a leakage resistance of as low as 20 meg ohms. Therefore, if a large time constant is desired, such as 10 seconds, by the series combination of a 10 meg ohm resistor and a 1 microferrad capacitor, the inherent leakage resistance shunting the capacitor will form a voltage divider with a 10 meg ohm resistor significantly reducing the voltage across the capacitor. In order to avoid these difficulties, the voltage average is formed by a nonlinear circuit in which the voltage $V_c$ across the capacitor C1 is fed back to the negative input of operational amplifier OP2 and the output voltage $V_s$ of operational amplifier OP2 is applied to the capacitor via a resistor $R_5$. The capacitor C1 is in the range of 0.1 to 10 microferrads and resistor $R_5$ is in the range of 1 to 5 meg ohms.

The circuit shown in FIG. 1 and described in detail in U.S. Pat. No. 4,992,731 utilizes a capacitor C1 for the purposes described above. It should be clearly understood that the overall operation of the remainder of the circuit in FIG. 1 is significantly different from the typical circuit used in a gear tooth sensor manufactured by the assignee of the present invention. The purpose of showing FIG. 1 and incorporating U.S. Pat. No. 4,992,731 by reference in this application is limited to the way in which the capacitor C1 is used to store a signal that is later applied, as a reference, to a comparator. The present invention, in contradistinction to the device represented in FIG. 1, stores a peak voltage value across a capacitor that represents a minimum gauss level signal provided by a Hall effect element in a gear tooth sensor. It does not actually store an average value. Instead, it stores a maximum voltage that represents a minimum gauss value that is used to provide two references (e.g. minimum plus 60 gauss and minimum plus 50 gauss) relating to turn on and turn off times in the creation of a square wave. This will be described in greater detail below.

Figure 2:
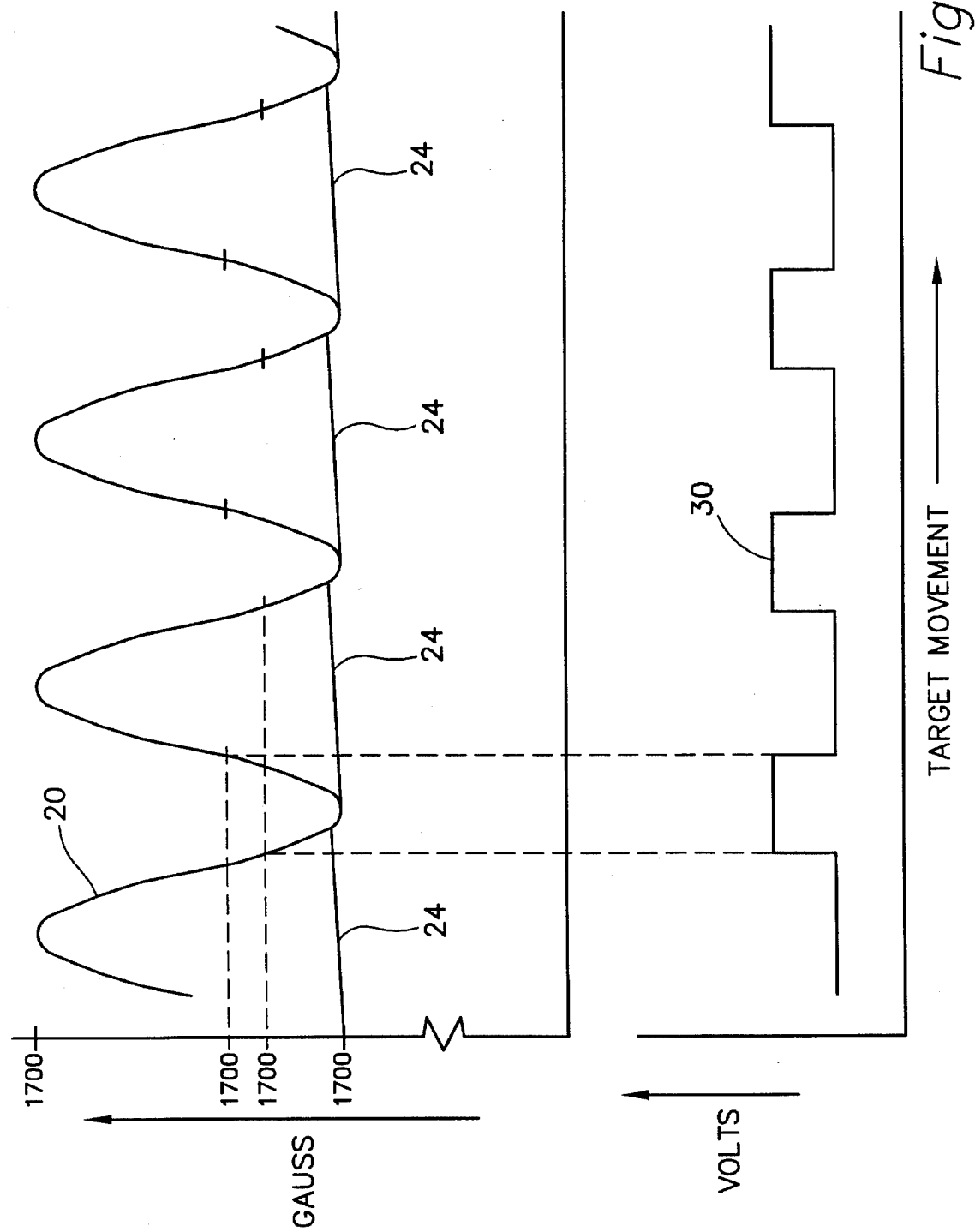
FIG. 2 illustrates a graphical representation of the variations in magnetic fields of a gear tooth sensor compared to a capacitor stored reference magnitude.

FIG. 2 illustrates an exemplary sinusoidal waveform 20 that is used to represent the changing magnetic field strength imposed on a Hall effect element of a gear tooth sensor as the gear rotates. It should be clearly understood that although the waveform is illustrated in FIG. 2 as a sinusoidal curve, the actual change in magnetic field strength is less uniform and not as smooth. However, the sinusoidal form serves as an exemplary curve to show the reason why the present invention in provided to a circuit used in conjunction with a gear tooth sensor. The illustrative waveform 20 illustrated in FIG. 2 has a bottom peak of 1500 gauss and a top peak of 1700 gauss. Two intermediate thresholds, 1550 gauss and 1560 gauss are used to trigger a comparison circuit that is used to identify the presence of a tooth or a slot passing through a detection zone of a gear tooth sensor. It should be understood that the increased magnetic strength of 1700 gauss represents the presence of a tooth and the lower value of 1500 gauss represents the value of an interstitial slot between teeth. The line identified by reference numeral 24 is FIG. 2 illustrates the gauss level represented by the voltage across the capacitor used in the gear tooth sensor circuit for the functions described above. When the value of curve 20 falls below the value of curve 24, curve 24 is lowered by a corresponding increase in the voltage across the capacitor. As the value of curve 20 rises, the capacitor slowly discharges as represented by the slight rise in curve 24 between minimum peaks of curve 20. Each time curve 20 falls below the magnitude of curve 24, curve 24 is lowered by charging the capacitor. The problems described above can be visualized in association with FIG. 2. If, because of an aberration, curve 24 is lowered by a corresponding increase in voltage across the capacitor, and no means is taken to discharge the capacitor at a predefined rate, the device could possibly malfunction without ever correcting itself. Since the values of 1550 gauss and 1560 gauss are determined relative to the magnitude of curve 24, a significant drop in the magnitude represented by curve 24 could seriously jeopardize the operation of the gear tooth sensor. In fact, if a voltage spike raises the voltage across the capacitor by a sufficient amount to drop the magnetic strength represented by curve 24 to a hypothetical value of 1400 gauss, the value of curve 24 would never drop below a value of 1450 gauss and therefore the device would cease to operate. The creation of the square wave signal 30 shown in FIG. 2 depends on the accurate maintenance of curve 24 as a representation of the bottom peak of curve 20. By providing a accurate rate of discharge of the capacitor as shown in FIG. 2, a gear tooth sensor can be assured that any momentary aberrations will eventually be corrected and the magnitude of curve 24 will rise to a sufficient gauss representation that the bottom peaks of curve 20 will again begin to reset the reference properly.

Figure 3:
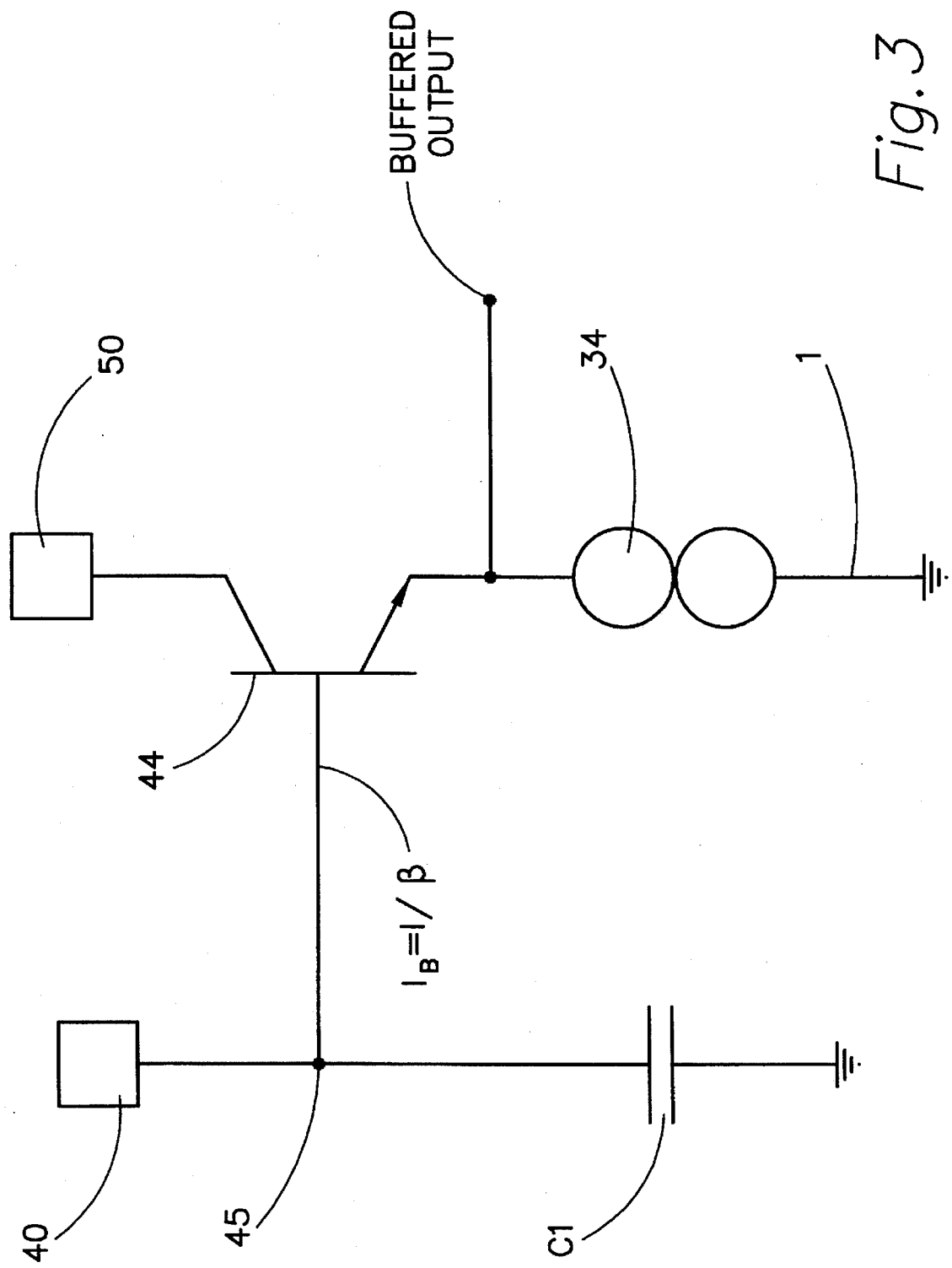
FIG. 3 shows one possible means for provided a small but accurate current for the purpose of discharging a capacitor at a preselected rate and providing a buffered output.

FIG. 3 is a representation of the technique provided by the present invention to discharge capacitor C1 at a precise predetermined rate. Box 40 in FIG. 3 represents the entire circuit of a gear tooth sensor such as shown in FIG. 1, or an alternative gear tooth sensor circuit, with the exception of capacitor C1. Capacitor C1 is shown connected to box 40 in the manner in which capacitor C1 is connected to the circuit in FIG. 1. Since the precise circuit of the gear tooth sensor is not limiting to the present invention, it is represented by box 40 in the remaining drawings.

With reference to FIG. 3, one possible way of discharging capacitor C1 is illustrated. A constant current source 34 could be provided as shown and connected between the emitter of a first transistor 44 and a point of ground potential. As shown, the base of the first transistor 44 could be connected to a first circuit point 45 between box 40 and the capacitor C1. As the constant current source 34 causes a current to flow through the first transistor 44 from a power source 50, a predefined base current $I_B$ would flow from the first circuit point 45 through the first transistor 44 and the capacitor would be discharged. Unfortunately, an arrangement such as that shown in FIG. 3 has serious drawbacks. If the current flowing through the constant current source 34 is I, the base current $I_B$ is equal to I divided by $\beta$. The transistor gain, or $\beta$, can be severely affected by temperature variations. Therefore, the effective base current $I_B$ is not always the same percentage of current I through the current source 34. In fact, temperature induced variations in $\beta$ can be very significant and the base current $I_B$ can vary by factors of greater than 10 to 1. Therefore, the approach shown in FIG. 3 is not a satisfactory solution to the problem of accurately discharging capacitor C1.

Figure 4:
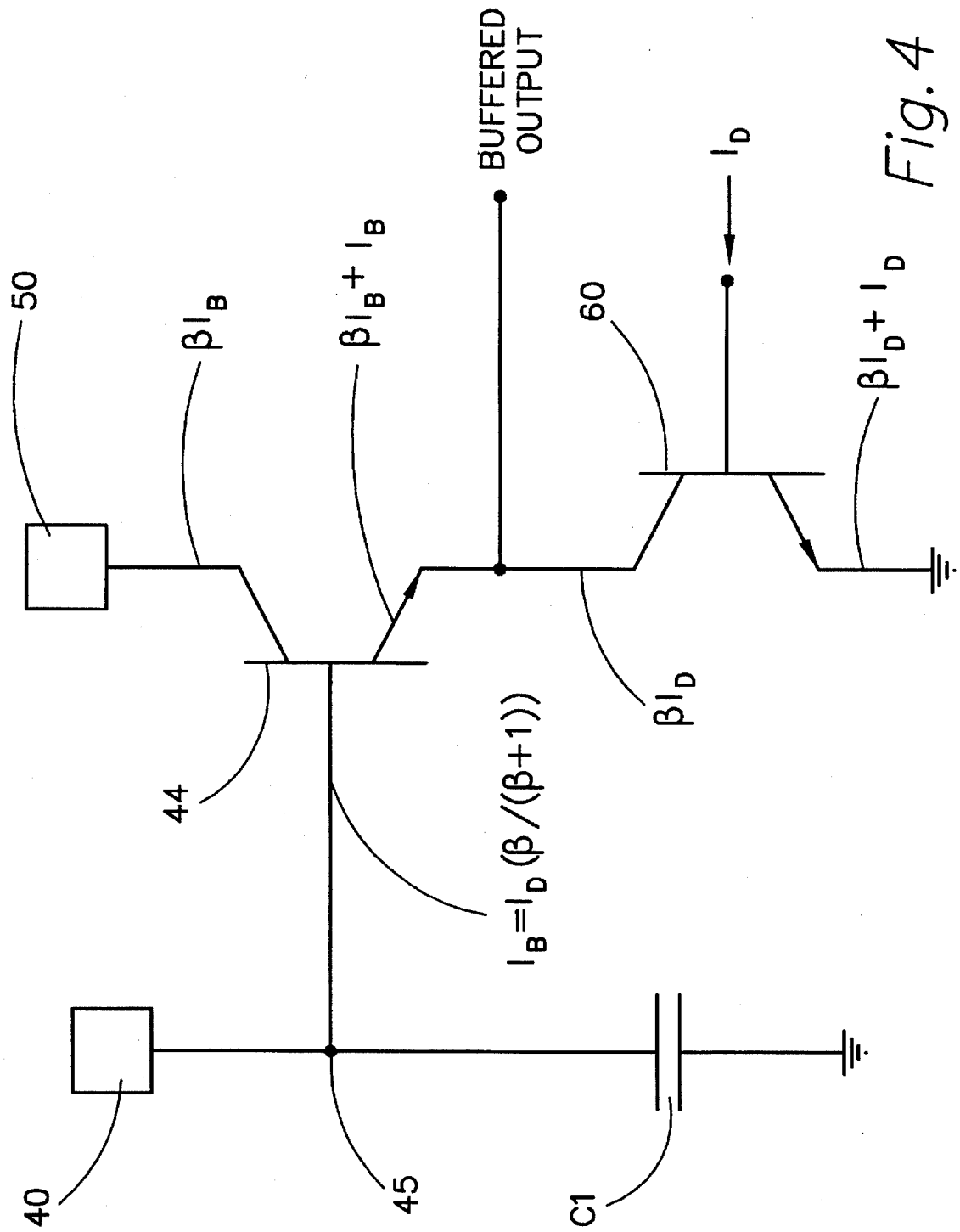
FIG. 4 shows an embodiment of the present invention used to discharge a capacitor at a preselected rate.

FIG. 4 is a discharge circuit made in accordance with the present invention which provides an accurate bleed current through the base of the first transistor 44 which is not susceptible to significant variation as a function of changes in the transistor gain $\beta$. As described above in conjunction with FIG. 3, temperature change can change the effective $\beta$ value of a transistor. In the configuration of FIG. 3, a change in the $\beta$ value from 20 to 40 for transistor 44 would result in the base current $I_B$ being halved. This magnitude of change in the base current of transistor 44, which controls the rate of discharge of capacitor C1, is unacceptable in situations where a controlled rate of discharge must be maintained.

FIG. 4 shows a preferred embodiment of the present invention. A second transistor 60 is connected with its collector connected in electrical communication with the emitter of the first transistor 44. The emitter of the second transistor 60 is connected to a point of ground potential. For purposes of this discussion, both the first transistor 44 and the second transistor 60 will be assumed to have identical $\beta$ values. However, as will be seen in the following discussion, the present invention does not require that the $\beta$ values of the first and second transistors be equal.

As described in conjunction with FIG. 3, a source of power 50 provides the availability of electrical current which, in FIG. 4, flows through the first and second transistors. With reference to FIG. 4, a precise base current $I_D$ is provided to the base of the second transistor 60. The current flowing through the collector of the second transistor 60 is therefore equal to $\beta I_D$ and the current flowing through the emitter of the second transistor 60 is defined as $\beta I_D + I_D$. Similarly, the current flowing through the collector of the first transistor 44, in terms of its own base current, is defined as $\beta I_B$ and the current flowing through the emitter of the first transistor 44 is defined as $\beta I_B + I_B$. Since the collector flowing through the emitter of the first transistor 44 must be equal to the current flowing through the collector of the second transistor 60, the base current of the first transistor is defined as:

$$I_B = I_D(\beta/(\beta+1)) \tag{1}$$

As can be seen, the base current of the first transistor 44 is defined as a function of the base current $I_D$ of the second transistor 60. The ratio between the two base currents is defined in terms of $\beta$. As can be seen from equation 1 above, an increase in $\beta$ from 20 to 40, because of temperature variations, would only have an affect on the base current of the first transistor 44 of less than 2.5 percent. Therefore, because of the relationship between the base current $I_D$ of the second transistor 60 and the base current $I_B$ of the first transistor 44, significant changes in $\beta$ will only have a relatively minor effect on the rate of discharge of capacitor C1. If a relatively precise base current $I_D$ can be provided to the second transistor 60, the rate of discharge of the capacitor C1 can be accurately maintained over wide temperature ranges. Since a typical $\beta$ value for a transistor is in the range of 100 to 300, it can be seen that the effect on the base current of the first transistor, as a function of temperature, will be smaller than the example used immediately above.

With continued reference to FIG. 4, it should be understood that the operation of the present invention benefits from the provision of an accurate base current $I_D$ to the second transistor 60. It should also be understood that, since the subcircuit shown in FIG. 4 is intended to discharge the capacitor C1 at a relatively slow but predictable rate, the base current of the second transistor 60 will have to be small in most applications. In order to provide a current of small magnitude, in the range of 10 nanoamperes to 100 nanoamperes, one possible technique that could be employed would comprise a relatively large resistor. However, when the circuitry is provided in the form of a microelectronic circuit, the provision of a large resistor can be difficult to accomplish. Furthermore, the use of a large resistor can be wasteful in terms of chip area. Therefore, it would be significantly beneficial to the operation of the subcircuit shown in FIG. 4 if a means were provided to supply a current of small magnitude to the base of the second transistor 60 without the need for large resistors.

Figure 5:
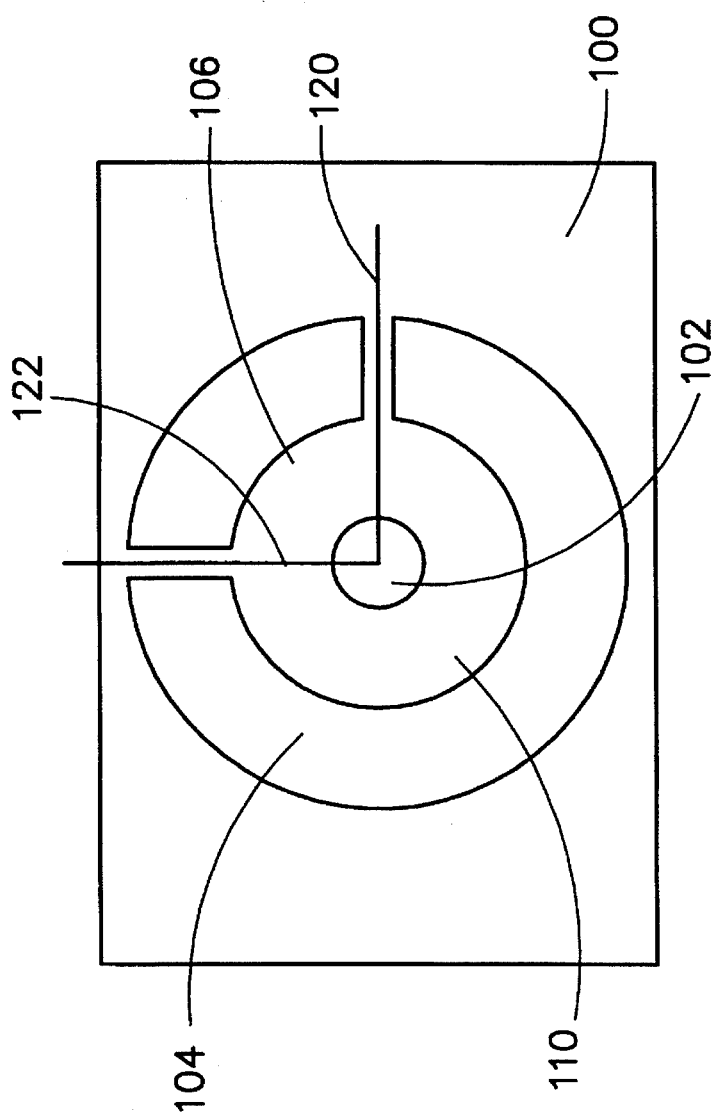
FIGS. 5 and 6 shows alternative views of a lateral PNP transistor.

Lateral PNP transistors are available in commercial quantities and are well known to those skilled in the art. For purposes of understanding the operation of the present invention, it is helpful if the configuration and operation of a lateral PNP transistor is well understood. FIG. 5 shows a top view of an exemplary lateral PNP transistor. The base 100 is provided with an emitter 102 that is created by doping the epitaxial layer with a P-type conductivity material. The base 100 is made of N-type conductivity material. A two part collector comprises segments 104 and 106 which are provided by doping the base 100 with P-type conductivity material. As can be seen in FIG. 5, the generally annular collector comprises two arcuate sections identified by reference numerals 104 and 106. As is generally known to those skilled in the art, the current flowing through each of the two arcuate sections of the collector is a function of the angular percentage of the entire collector that each portion provides. In FIG. 5, lines 120 and 122 divide the portion of the collector provided by segment 106 and segment 104. If lines 120 and 122 define segment 106 of the collector as being 90 degrees and define segment 104 of the collector as being 270 degrees, one quarter of the current flowing from the emitter 102 would flow through segment 106 and three quarters of the current flowing from emitter 102 would flow through segment 104. This ratio, in the terminology normally used by those skilled in the art, would be a three to one ratio that is normally represented by N.

Figure 6:
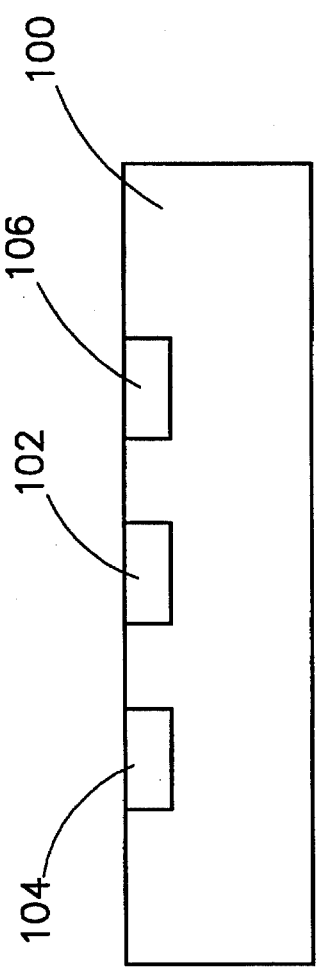

FIG. 6 is a sectional view of the representation of FIG. 5 taken through the device collinear with line 120. It shows the position of the emitter 102 relative to the annular collector which, in the illustration of FIG. 6, is shown as segment 104 and segment 106. The emitter and collector are doped regions in the base 100. The use of a lateral PNP transistor in a preferred embodiment of the present invention is as a means for providing a ratio of currents.

Figure 7:
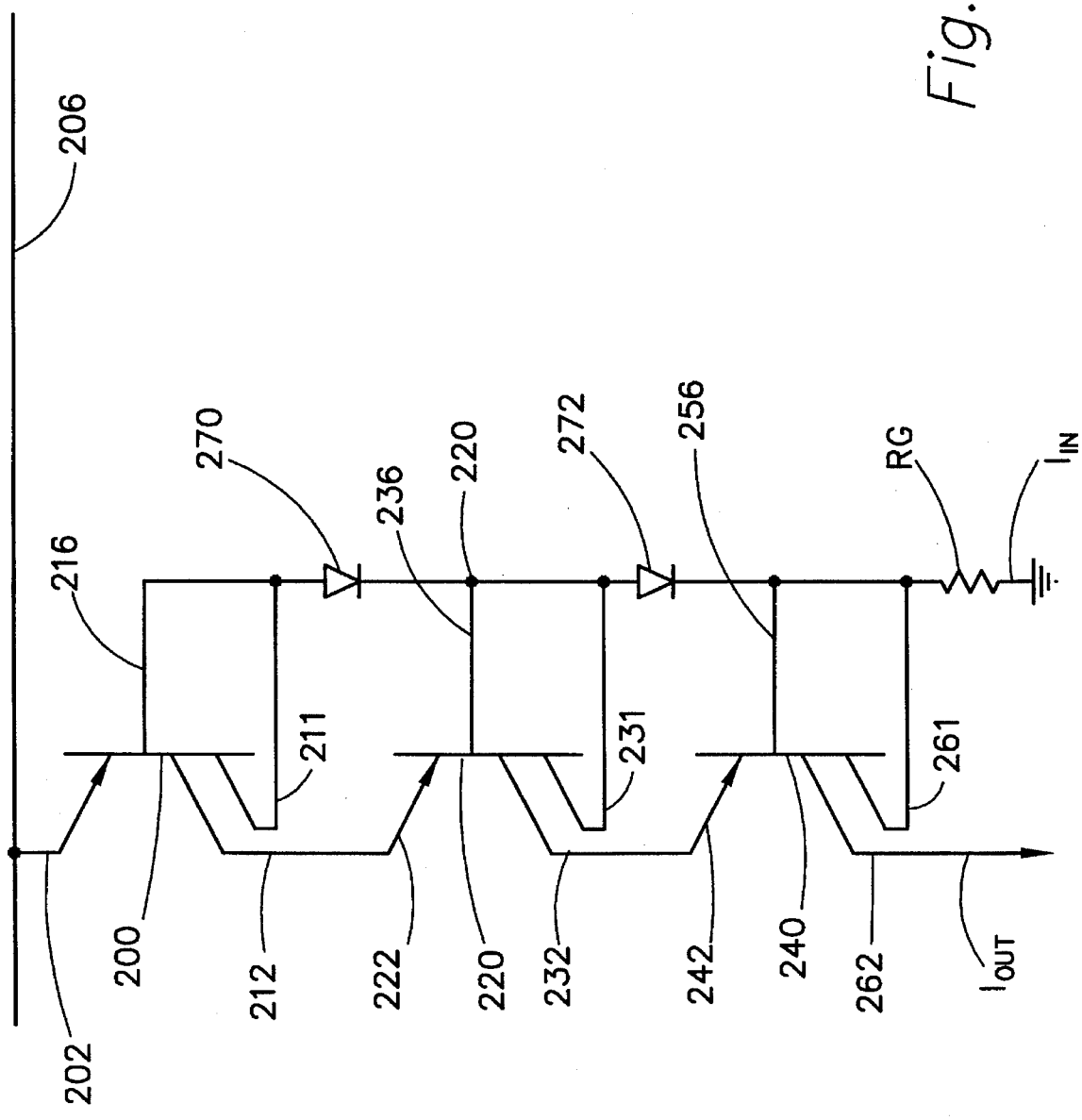
FIG. 7 shows an embodiment of the present invention that provides a current of very small magnitude.

FIG. 7 illustrates three lateral PNP transistors connected to form a three stage arrangement that is used advantageously by the present invention to provide an accurate and very small current for use as the base current of the second transistor 60 shown in FIG. 4. A first lateral PNP transistor 200 is provided and its emitter 202 is connected to a source of current, such as line 206 that is connected to a power supply. The first lateral PNP transistor 200 has a first collector 211 and a second collector 212. As is known to those skilled in the art and as described above, the current carried by the first collector 211 is larger than the current carried by the second collector 212 by a factor that is generally referred to as N. The first collector 211 is connected to the base 216 of the first lateral PNP transistor 200. A second lateral PNP transistor 220 has an emitter 222 that is connected to the second collector 212 of the first lateral PNP transistor 200 as illustrated in FIG. 7. The second lateral PNP transistor 220 has a third collector 231 and a fourth collector 232. The third collector 231 is connected to the base 236 of the second lateral PNP transistor 220. As can be seen, the base 216 of the first lateral PNP transistor is connected to the base 236 of the second lateral PNP transistor 220.

With continued reference to FIG. 7, a third lateral PNP transistor 240 is connected with its emitter 242 connected to the fourth collector 232 of the second lateral PNP transistor 220. In a manner similar to that described above with respect to the other two lateral PNP transistors, a fifth collector 261 and a sixth collector 262 are provided in the third lateral PNP transistor 240. The fifth collector 261 is connected as shown to the base 256 of the third lateral PNP transistor 240. The base 256 is connected to a point of ground potential through a source of current represented by RG.

FIG. 7 shows a three stage version of the present invention. It should be understood that the number of stages illustrated in FIG. 7 and described herein is not a limitation on the present invention. Depending on the magnitude of the current required, various numbers of stages can be provided according to the principles described herein. A typical application of the present invention would connect the sixth collector 262 to the base of the second transistor 60 shown in FIG. 4 and the current identified as $I_{OUT}$ in FIG. 7 would provide the small current $I_D$ at the base of the second transistor 60. The configuration shown in FIG. 7 achieves the goal of providing a very small current while avoiding the need for large resistors.

With continued reference to FIG. 7, it can be shown that the relationship of $I_{IN}$ and $I_{OUT}$ can be defined as:

$$I_{IN}=I_{OUT}(N(N+1)^2+N(N+1)+N) \quad (2)$$

The current flowing through the fourth collector 232 and the emitter 242 of the third lateral PNP transistor 240 is defined as:

$$I_{232}=(N+1)I_{OUT} \quad (3)$$

The current flowing through the second diode 272 is defined as:

$$I_{272}=I_{OUT}(N(N+1)^2+N(N+1)) \quad (4)$$

The current flowing through the second collector 212 of the first lateral PNP transistor 200 and the emitter 222 of the second lateral PNP transistor 220 is defined as:

$$I_{212}=(N+1)^2 I_{OUT} \quad (5)$$

Similarly, the current flowing through the first diode 270 is defined as:

$$I_{270}=N(N+1)^2 I_{OUT} \quad (6)$$

The current flowing through the emitter 202 of the first lateral PNP transistor 200 is defined as:

$$I_{202}=I_{OUT}+I_{IN} \quad (7)$$

With continued reference to FIG. 7, it can be seen that by providing a relatively large current as $I_{IN}$, a very small current $I_{OUT}$ can be provided without the need of using large resistors which have the disadvantages described above. As an example, with reference to FIG. 7, if N is equal to 7, the provided current $I_{IN}$ will be 511 times the output current $I_{OUT}$ flowing through the sixth collector 262 of the third lateral PNP transistor 240. If a current source $I_{IN}$ of 25.0 microamperes is provided, an output current $I_{OUT}$ of approximately 50 nanoamperes can be provided. Therefore, the arrangement in FIG. 7 enables the user to provide an extremely small current $I_{OUT}$ through the use of three lateral PNP transistors and without the need for large resistors. Although the device illustrated in FIG. 7 is a three stage device, it should be understood that the use of two lateral PNP transistors would provide a significant reduction in current at the output from the fourth collector 232 of the second lateral PNP transistor 220.

Figure 8:
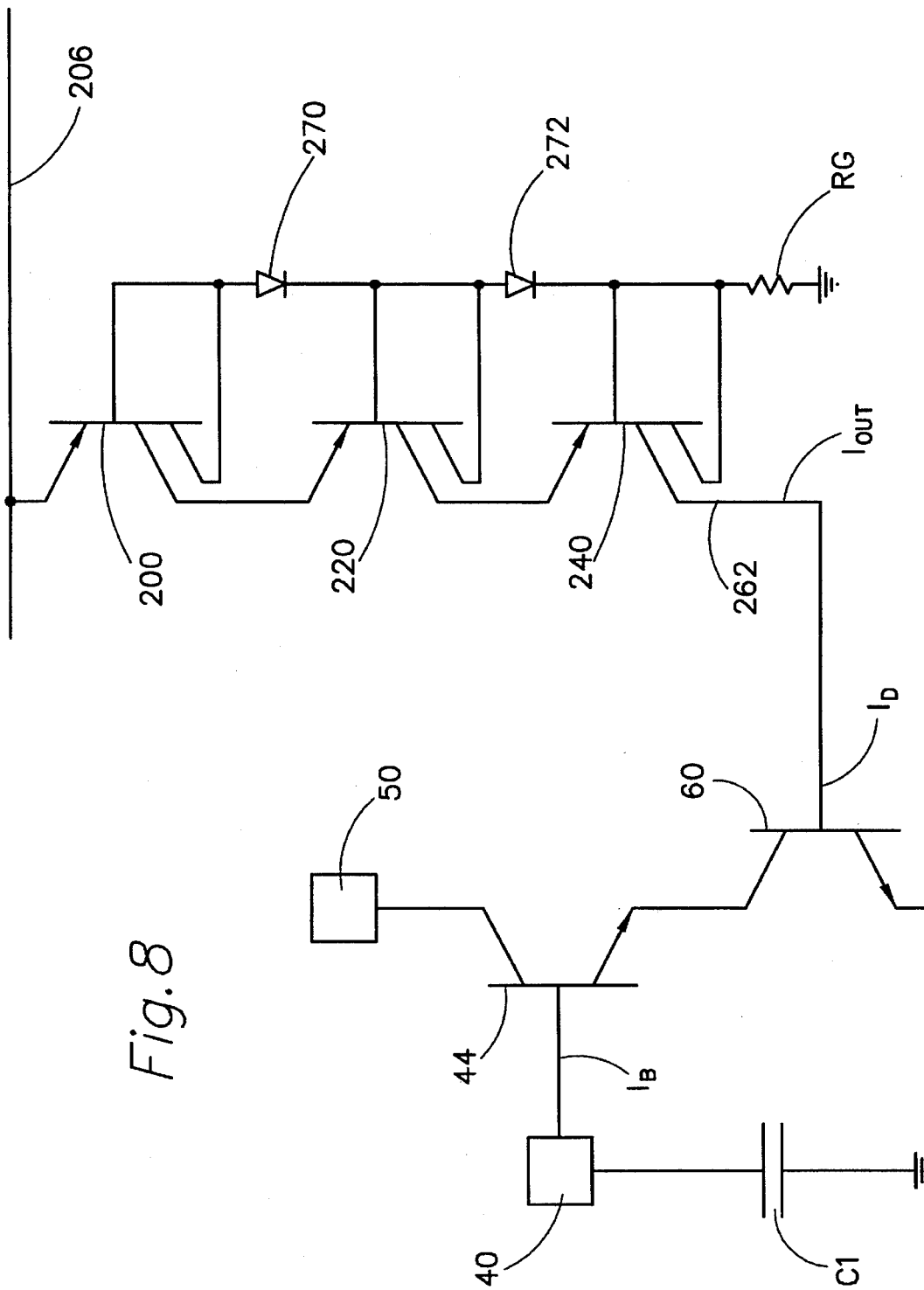
FIG. 8 shows the circuits of FIGS. 4 and 7 combined together according to one embodiment of the present invention.

FIG. 8 shows the circuit of FIG. 7 combined with the circuit of FIG. 3. As can be seen, the sixth collector 262 of the third lateral PNP transistor 240 provides a current $I_{OUT}$ to the base of the second transistor 60 which requires a current $I_D$ in order to provide the base current $I_B$ of the first transistor 44 as described above.

For the purpose of describing the operation of the circuit in FIG. 7, it was assumed that the ratio of currents between the first and second collectors is the same as the ratio of currents between the third and fourth collectors. Furthermore, it was also assumed that the ratio of currents between the fifth and sixth collectors is the same as the ratios described immediately above. Although this characteristic is not a requirement of the present invention, it simplifies the discussion and the representation of the currents in mathematical form as shown above. The circuit in FIG. 7 provides a small and accurate current $I_{OUT}$ which enables the circuit in FIG. 4 to operate in its intended manner as described above. FIG. 8 shows the combination of these two circuits. Although the two circuits have been described in relation to each other, it should be understood that either the circuit in FIG. 4 or the circuit in FIG. 7 can be used without the other.

The embodiments of the invention in which an exclusive property or right is claimed are defined as follows:

1. A subcircuit for providing a current, comprising:

a first lateral PNP transistor having a first collector and a second collector, said first collector being configured to conduct a current N times the current conducted by said second collector, said first collector being connected to the base of said first lateral PNP transistor;

means for providing a first current as an input to the emitter of said first lateral PNP transistor; and a second lateral PNP transistor having a third collector and a fourth collector, said third collector being configured to conduct a current M times the current conducted by said fourth collector, said third collector being connected to the base of said second lateral PNP transistor, said second collector being connected to the emitter of said second lateral PNP transistor, said base of said first lateral PNP transistor being connected to said base of said second lateral PNP transistor, said fourth collector conducting a current which is a first predetermined fraction of said first current.

2. The subcircuit of claim 1, further comprising:

a third lateral PNP transistor having a fifth collector and a sixth collector, said fifth collector being configured to conduct a current X times the current conducted by said sixth collector, said fifth collector being connected to the base of said third lateral PNP transistor, said fourth collector being connected to the emitter of said third lateral PNP transistor, said base of said second lateral PNP transistor being connected to said base of said third lateral PNP transistor, said sixth collector conducting a current which is a second predetermined fraction of said first current.

3. The subcircuit of claim 2, further comprising:

a first diode connected between said base of said first lateral PNP transistor and said base of said second lateral PNP transistor.

4. The subcircuit of claim 3, further comprising:

a second diode connected between said base of said third lateral PNP transistor and said base of said second lateral PNP transistor.

5. A subcircuit for providing a current, comprising:

a first lateral PNP transistor having a first collector and a second collector, said first collector being configured to conduct a current N times the current conducted by said second collector, said first collector being connected to the base of said first lateral PNP transistor;

means for providing a first current as an input to the emitter of said first lateral PNP transistor;

a second lateral PNP transistor having a third collector and a fourth collector, said third collector being configured to conduct a current M times the current conducted by said fourth collector, said third collector being connected to the base of said second lateral PNP transistor, said second collector being connected to the emitter of said second lateral PNP transistor, said base of said first lateral PNP transistor being connected to said base of said second lateral PNP transistor, said fourth collector conducting a current which is a first predetermined fraction of said first current; and a third lateral PNP transistor having a fifth collector and a sixth collector, said fifth collector being configured to conduct a current X times the current conducted by said sixth collector, said fifth collector being connected to the base of said third lateral PNP transistor, said fourth collector being connected to the emitter of said third lateral PNP transistor, said base of said second lateral PNP transistor being connected to said base of said third lateral PNP transistor, said sixth collector conducting a current which is a second predetermined fraction of said first current.

6. The subcircuit of claim 5, further comprising:

a first diode connected between said base of said first lateral PNP transistor and said base of said second lateral PNP transistor.

7. The subcircuit of claim 6, further comprising:

a second diode connected between said base of said third lateral PNP transistor and said base of said second lateral PNP transistor.

8. A subcircuit for providing a current, comprising:

a first lateral PNP transistor having a first collector and a second collector, said first collector being configured to conduct a current N times the current conducted by said second collector, said first collector being connected to the base of said first lateral PNP transistor;

means for providing a first current as an input to the emitter of said first lateral PNP transistor;

a second lateral PNP transistor having a third collector and a fourth collector, said third collector being configured to conduct a current M times the current conducted by said fourth collector, said third collector being connected to the base of said second lateral PNP transistor, said second collector being connected to the emitter of said second lateral PNP transistor, said base of said first lateral PNP transistor being connected to said base of said second lateral PNP transistor, said fourth collector conducting a current which is a first predetermined fraction of said first current;

a third lateral PNP transistor having a fifth collector and a sixth collector, said fifth collector being configured to conduct a current X times the current conducted by said sixth collector, said fifth collector being connected to the base of said third lateral PNP transistor, said fourth collector being connected to the emitter of said third lateral PNP transistor, said base of said second lateral PNP transistor being connected to said base of said third lateral PNP transistor, said sixth collector conducting a current which is a second predetermined fraction of said first current; and a first diode connected between said base of said first lateral PNP transistor and said base of said second lateral PNP transistor.

9. The subcircuit of claim 8, further comprising:

a second diode connected between said base of said third lateral PNP transistor and said base of said second lateral PNP transistor.

10. The subcircut of claim 1, wherein:

M and N are equal to each other.

11. The subcircuit of claim 2, wherein:

M, N and X are equal to each other.

12. The subcircuit of claim 5, wherein:

M, N and X are equal to each other.

13. The subcircuit of claim 8, wherein:

M, N and X are equal to each other.

* * * * *